United States Patent
Chen et al.

(10) Patent No.: US 6,317,306 B1
(45) Date of Patent: Nov. 13, 2001

(54) ELECTROSTATIC DISCHARGE PROTECTION CIRCUIT

(75) Inventors: Shiao-Shien Chen, Chung-Li; Tien-Hao Tang, Taipei Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/531,904

(22) Filed: Mar. 20, 2000

(30) Foreign Application Priority Data

Mar. 10, 2000 (TW) .............................. 89104357 .A

(51) Int. Cl.$^7$ .............................. H02H 9/00; H01L 23/62
(52) U.S. Cl. .............................. 361/56; 257/357
(58) Field of Search .............................. 361/54, 56, 58, 361/91, 111; 257/355–363

(56) References Cited

U.S. PATENT DOCUMENTS

| | | | |
|---|---|---|---|
| 5,208,719 | * | 5/1993 | Wei ......................................... 361/56 |
| 6,128,171 | * | 10/2000 | Iniewski et al. ......................... 361/56 |
| 6,160,457 | * | 12/2000 | Wu ................................. 331/116 FE |

* cited by examiner

*Primary Examiner*—Matthew Nguyen
(74) *Attorney, Agent, or Firm*—Jiawei Huang; J. C. Patents

(57) ABSTRACT

An electrostatic discharge (ESD) protection circuit. A first NMOS transistor has a source and a gate terminal connected to a ground voltage and a drain terminal connected to the I/O pad. A second NMOS transistor has its source terminal connected to the I/O pad, its drain terminal connected to a voltage source and its gate and substrate terminal connected to the ground voltage. A first PMOS transistor has its drain terminal connected to the ground voltage and a substrate terminal of the first NMOS transistor, its gate terminal connected to the voltage source and its source and substrate terminal connected to the I/O pad. A second PMOS transistor has its source and gate terminal connected to the voltage source, its drain terminal connected to the I/O pad and its substrate terminal connected to a drain terminal of the second NMOS transistor. According to the ESD protection circuit of the invention, whether a positive voltage stress is applied to ground voltage VSS or a negative voltage stress is applied to voltage source VDD, both the parasitic BJT of the first NMOS transistor and the second PMOS transistor can be turned on in advance by triggering the junctions between their substrates and sources, and the capacity of the ESD protection circuit in this invention is thus improved.

3 Claims, 4 Drawing Sheets

ELECTROSTATIC DISCHARGE PROTECTION CIRCUIT

CROSS-REFERENCE TO RELATED APPLICATION

This application claims the priority benefit of Taiwan application Ser. No. 89104357, filed Mar. 10, 2000.

BACKGROUND OF THE INVENTION

1. Field of the Invention

The present invention relates to an electrostatic discharge (ESD) protection circuit. More particularly, the present invention relates to an ESD protection circuit, of which the parasitic BJT can be turned on in advance by triggering a substrate under ESD stress conditions, so that the ESD capacity can be enhanced.

2. Description of the Related Art

Electrostatic discharge (ESD) can easily damage IC devices such as DRAMs and SRAMs during both manufacture and operation. A person walking on a carpet, for instance, can carry up to several thousand volts of electrostatic charge under high relative humidity (RH) conditions and over 10,000 volts under low RH conditions. If such a person touches an IC package, the electrostatic charge on his/her body is instantly discharged to the IC package, thus causing ESD damage to the internal circuitry of the IC package. A widely used solution to this problem is to provide an on-chip ESD protection circuit around each I/O pad of the IC package.

One drawback to the prior art, however, is that when the IC device is fabricated by scaled down technology, such as the deep-submicron CMOS process, the gate-oxide structure is reduced in thickness. This causes the breakdown voltage of the gate-oxide structure to be close to or below the breakdown voltage at the source/drain junction, thus degrading the ESD protection capability. The internal circuitry of an IC device is typically drawn in accordance with the Minimum Design Rules. Therefore, the various semiconductor components of an IC device are designed to have the minimum size. This practice, however, makes some components vulnerable to ESD stress when these components are further scaled down. For this reason, a highly integrated IC device fabricated by deep-submicron process is particularly vulnerable to ESD. Therefore, in the IC industry, much research effort has been directed to ESD protection for integrated circuitry.

FIG. 1 is a circuit diagram for a conventional ESD protection circuit. As shown in FIG. 1, in order to protect the internal circuit 16, the ESD current imported through an input/output (I/O) pad 10 can be discharged not only through an NMOS transistor 12 to the ground VSS but also through a PMOS transistor 14 to a voltage source VDD.

The conventional ESD protection circuits as described above and shown in FIG. 1 utilizes junction breakdown voltage to protect the internal circuit 16 from damage. In order to protect internal circuit 16, the conventional operation method utilizes a parasitic bipolar device to discharge the ESD current imported through the I/O pad 10, that is, the conventional method utilizes hole current (electron current) generated by drain junction avalanche breakdown to trigger a P-N junction (that is, trigger a parasitic BJT to turn on) between substrate and source of NMOS transistor 12 (or PMOS transistor 14) to turn on.

However, whether the P-N junction between substrate and source is easily turned on has a direct effect on the ESD protection circuit capability. Thus, in the future development for ESD protection circuit, this is a key technology for how to advanced turn on parasitic BJT in ESD stress condition so as to enhance the internal circuit protection capability.

In addition, when the IC device is fabricated by a scaled down CMOS process and the gate-oxide structure is accordingly reduced in thickness, some problems arise; for example, the breakdown voltage of the gate-oxide structure happens earlier than the junction breakdown voltage at the source/drain junction. In other words, if the breakdown voltage of the gate-oxide structure happens earlier than the junction breakdown voltage at the source/drain junction, then the conventional ESD protection circuits shown in FIG. 1 lose their protective ability.

SUMMARY OF THE INVENTION

The invention provides an electrostatic discharge (ESD) protection circuit disposed between an I/O pad and an internal circuit. The ESD protection circuit comprises two NMOS transistors and two PMOS transistors. A first NMOS transistor further comprises a source terminal, a drain terminal, a gate terminal and a substrate terminal, wherein the source and gate terminals are connected to a ground voltage and the drain terminal is connected to the I/O pad. A second NMOS transistor further comprises a source terminal, a drain terminal, a gate terminal and a substrate terminal, wherein the source terminal is connected to the I/O pad, the drain terminal is connected to a voltage source and the gate and substrate terminals are connected to the ground voltage. A first PMOS transistor further comprises a source terminal, a drain terminal, a gate terminal and a substrate terminal, wherein the drain terminal is connected to the ground voltage and the substrate terminal of the first NMOS transistor, the gate terminal is connected to the voltage source and the source and substrate terminals are connected to the I/O pad. Finally, a second PMOS transistor further comprises a source terminal, a drain terminal, a gate terminal and a substrate terminal, wherein the source and gate terminals are connected to the voltage source, the drain terminal is connected to the I/O pad and the substrate terminal is connected to the drain terminal of the second NMOS transistor. Furthermore, the ESD protection circuit of the invention further comprises a first resistor and a second resistor, wherein the first resistor is disposed between the drain terminal of the first PMOS transistor and the ground voltage, and the second resistor is disposed between the drain terminal of the second NMOS transistor and the voltage source.

According to the ESD protection circuit of the invention, whether a positive voltage stress is applied to ground voltage VSS or a negative voltage stress is applied to voltage source VDD, both the parasitic BJT of the first NMOS transistor and the second PMOS transistor can be turned on in advance by triggering the junctions between their substrates and sources, and the ESD stress then can be discharged to the ground voltage VSS and the voltage source VDD, so that the capacity of the ESD protection circuit in this invention is thus improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
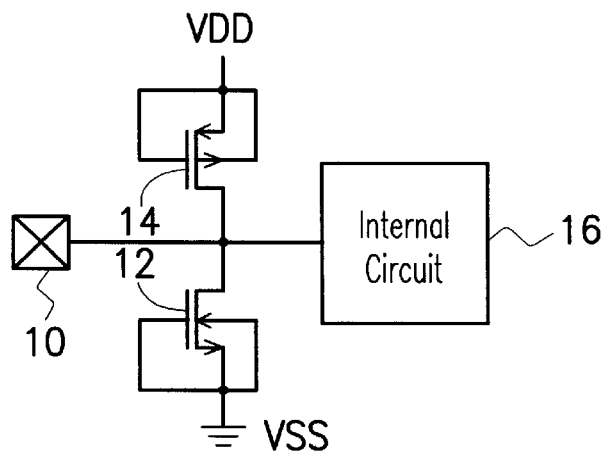
FIG. 1 is a circuit diagram for a conventional ESD protection circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
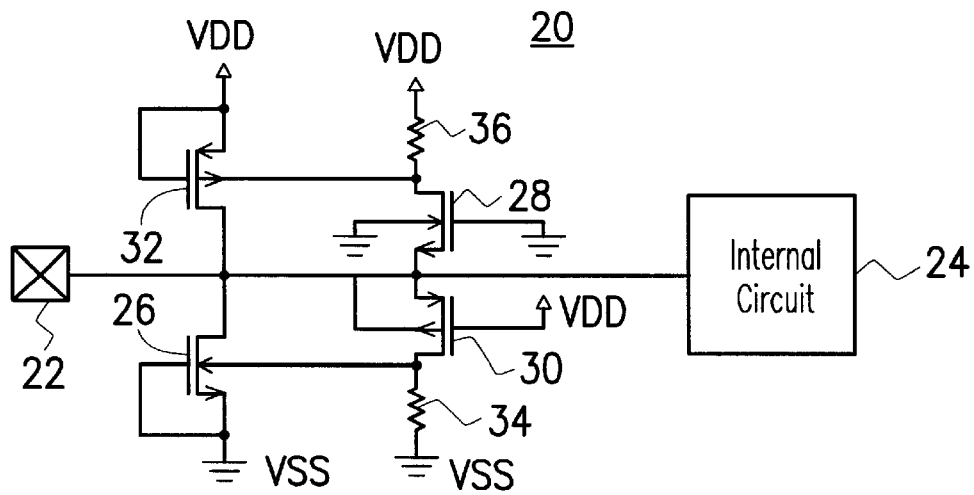
FIG. 2 is a circuit diagram of an ESD protection circuit according to a preferred embodiment of the present invention.

FIG. 2 is a circuit diagram of an ESD protection circuit according to a preferred embodiment of the present invention.

As shown in FIG. 2, the ESD protection circuit 20 is disposed between an I/O pad 22 and an internal circuit 24. The ESD protection circuit 20 comprises two NMOS transistors 26, 28 and two PMOS transistors 30, 32. The ESD protection circuit 20 further comprises two resistors 34 and 36 for limiting current.

The connection relationship is introduced as follows. A source and a gate terminal of the NMOS transistor 26 are connected to a ground voltage VSS (referred to as the ground pad), a drain terminal of the NMOS transistor 26 is connected to the I/O pad 22 and a substrate terminal of the NMOS transistor 26 is connected to a drain terminal of the PMOS transistor 30. The NMOS transistor 28 has a source terminal connected to the I/O pad 22, a gate and a substrate terminal connected to the ground voltage VSS and a drain terminal connected to a substrate terminal of the PMOS transistor 32. The PMOS transistor 30 has a source and a substrate terminal connected to the I/O pad 22 and a gate terminal connected to the voltage source VDD (referred to as the voltage source pad). The PMOS transistor 32 has a source and a gate terminal connected to the voltage source VDD and a drain terminal connected to the I/O pad 22.

Figure 3:
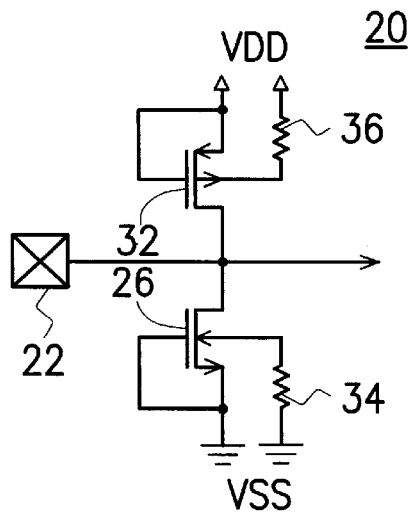
FIG. 3 is a circuit diagram of an ESD protection circuit according to the present invention under a normal operation condition.

Under normal operation conditions, because the gate of NMOS transistor 28 is connected to the ground voltage VSS and the gate of PMOS transistor 30 is connected to the voltage source VDD, the NMOS transistor 28 and the PMOS transistor 30 are turned off. Thus, as shown in FIG. 3, the structure of ESD protection circuit 20 is the same as the conventional structure. Furthermore, the NMOS transistor 26 and the PMOS transistor 32 are also turned off; therefore, the leakage current path is not existent, and the normal operation conditions are not affected.

Figure 4A:
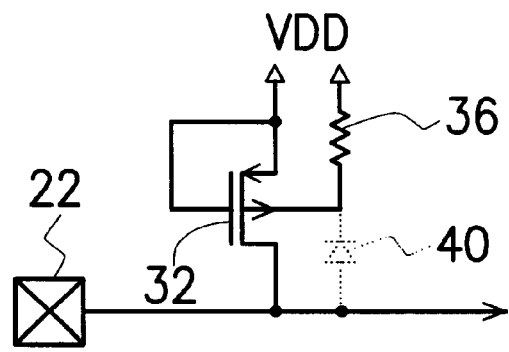
FIG. 4A is a circuit diagram of an ESD protection circuit according to the present invention under a condition of a positive stress voltage to a voltage source pad.

FIG. 4A shows the structure of ESD protection circuit 20 when ESD occurs, taking a positive stress to VDD as an example. Since the parasitic diode 40 across the drain and substrate terminal of the PMOS transistor 32 has a forward bias, the positive stress voltage on the I/O pad 22 can be discharged to the voltage source pad VDD through the parasitic diode 40. That is, the parasitic diode 40 of the PMOS transistor 32 provides an electric discharge path.

Figure 4B:
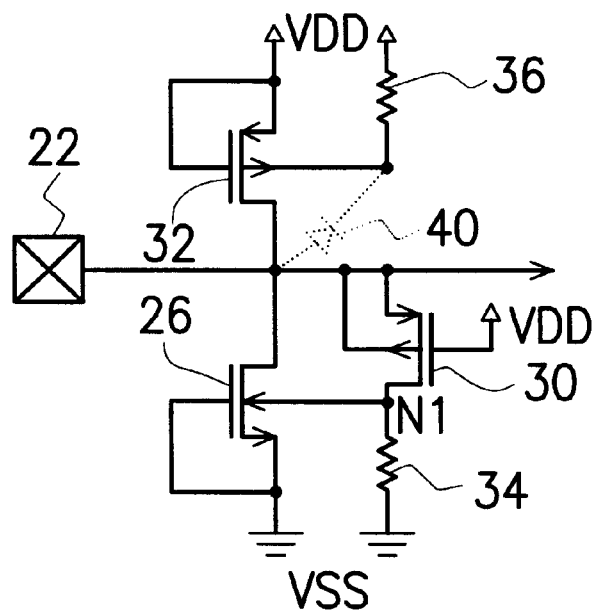
FIG. 4B is a schematic, circuit diagram of an ESD protection circuit according to the present invention under a condition of a positive stress voltage to a ground pad.

On the other hand, FIG. 4B shows the structure of ESD protection circuit 20 under a positive stress to VSS, for example. The voltage source pad VDD is in a floating state (under an abnormal operation condition), so that the positive stress voltage imported through I/O pad 22 can be coupled to the voltage source pad VDD via the parasitic diode 40 between the drain and substrate of PMOS transistor 32 through resistor 36. Then, the positive stress voltage flowing into the voltage source pad VDD can be transmitted to the gate of PMOS transistor 30. Thereafter, the positive stress voltage on the gate of PMOS transistor 30 can be coupled to its drain as well as to a node N1 in FIG. 4B through the overlap capacitor between drain and gate of PMOS transistor 30, so as to trigger the junction between the substrate and source of NMOS transistor 26. As a result, the parasitic BJT of NMOS transistor 26 is turned on and the positive stress voltage imported through I/O pad 22 can be discharged to ground pad VSS through NMOS transistor 26.

Figure 5A:
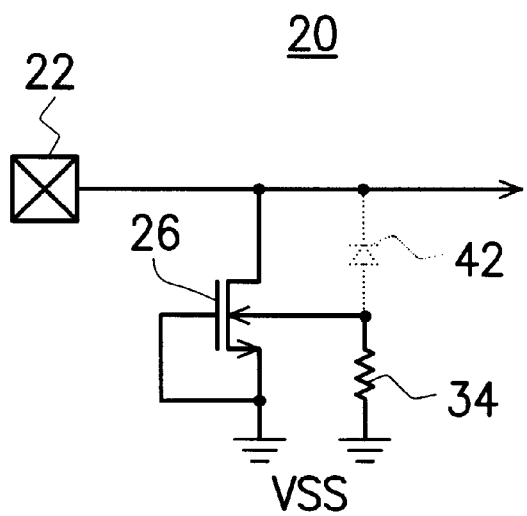
FIG. 5A is a circuit diagram of an ESD protection circuit according to the present invention under a condition of a negative stress voltage to a ground pad.

The same result occurs under a negative stress condition. FIG. 5A shows the structure of ESD protection circuit 20 when the electrostatic discharge of a negative tress occurs, taking a negative stress to VSS as an example. The parasitic diode 42 of the NMOS transistor 26 provides an electric discharge path, so that the negative stress voltage imported through the I/O pad 22 can be discharged to the ground pad VSS through the parasitic diode 42.

Figure 5B:
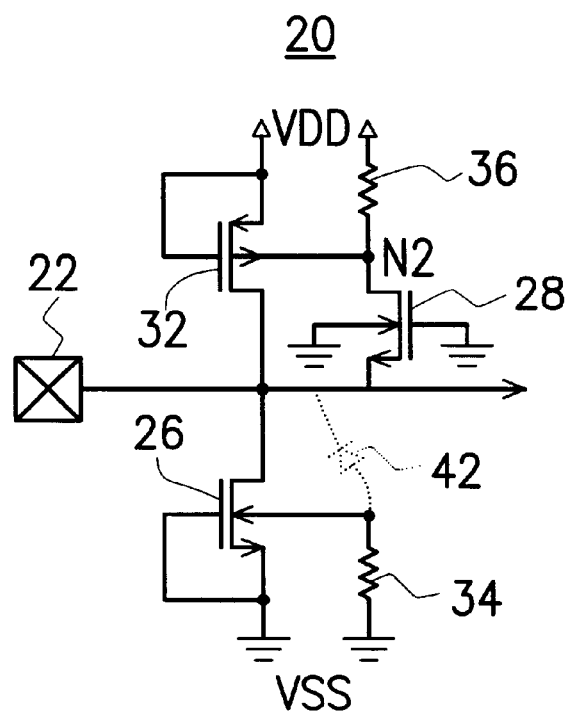
FIG. 5B is a circuit diagram of an ESD protection circuit according to the present invention under a condition of a negative stress voltage to a voltage source pad.

On the other hand, FIG. 5B shows the structure of ESD protection circuit 20 with a negative stress to VDD, for example. Similarly, the ground pad VSS is in floating state (under an abnormal operation condition), so that the negative stress voltage imported through I/O pad 22 can be coupled to the ground pad VSS via the parasitic diode 42 between the drain-substrate of NMOS transistor 26 through resistor 34. Then, the negative stress voltage flowing into the ground pad VSS can be transmitted to the gate of NMOS transistor 28. Thereafter, the negative stress voltage on the gate of NMOS transistor 28 can be coupled to its drain as well as a node N2 in FIG. 5B through the overlap capacitor between the drain and gate of NMOS transistor 28, so as to trigger the junction between the substrate and source of PMOS transistor 32. As a result, the parasitic BJT of PMOS transistor 32 is turned on and the negative stress voltage imported through the I/O pad 22 can be discharged to voltage source pad VDD through PMOS transistor 32.

As described above, the parasitic BJT in the ESD protection circuit 20 of the invention can be turned on in advance by triggering the substrate under ESD stress conditions, so that the ESD performance can be enhanced.

Figure 6:
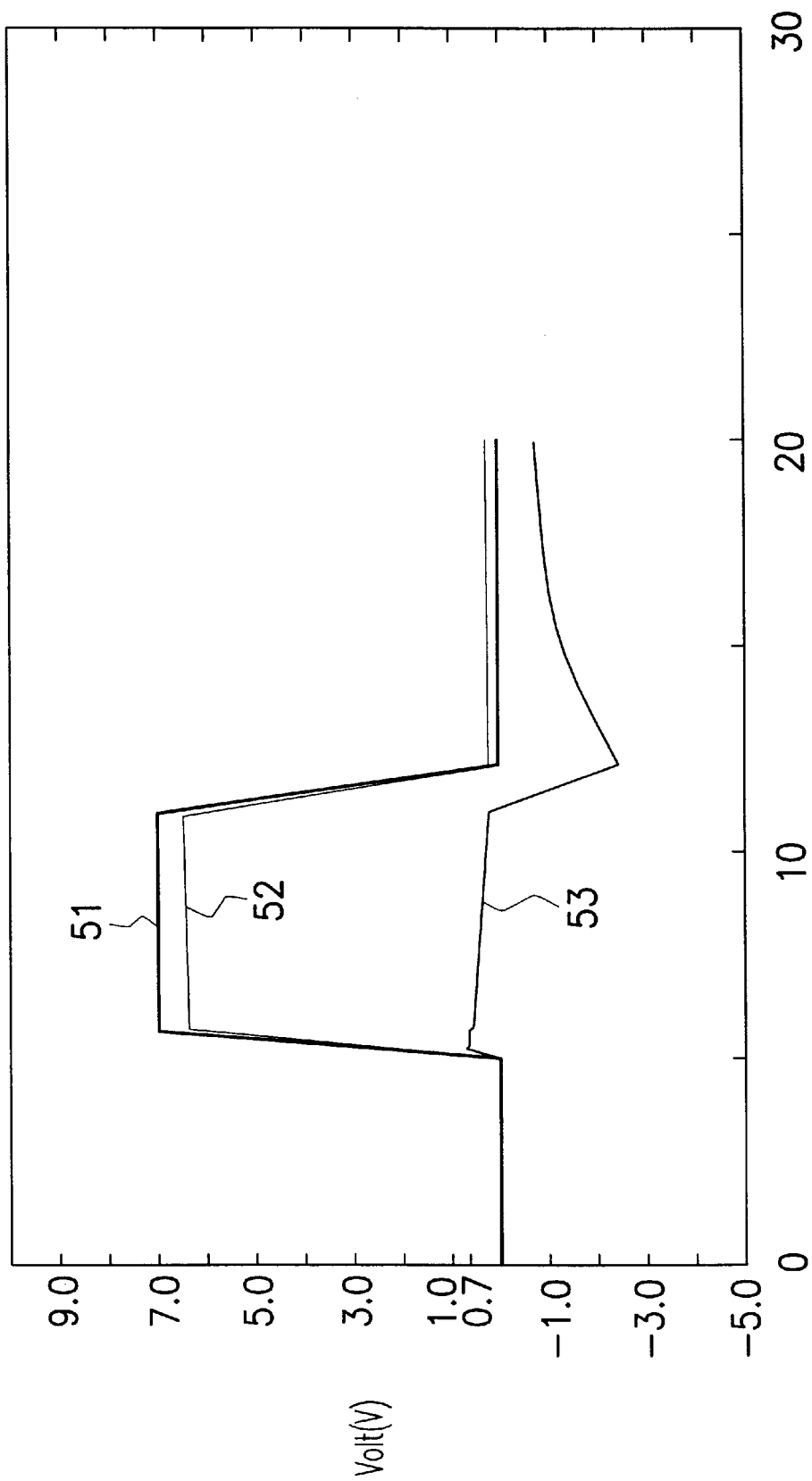
FIG. 6 is a fluctuation diagram of various nodes in an ESD protection circuit according to the present invention under a condition of a positive stress voltage to a ground pad.

Referring to FIG. 4B and FIG. 6, FIG. 6 is a fluctuation diagram of various nodes in an ESD protection circuit according to the present invention under a condition of a positive stress voltage to a ground pad.

In FIG. 6, a curve 51 represents the relationship of voltage-time (V-T) on the I/O pad 22, a curve 52 represents the relationship of voltage-time on the voltage source pad VDD and a curve 53 represents the relationship of voltage-time on the node N1. Obviously, before the voltage of I/O pad 22 reaches 7 volts (V) yet, the voltage of node N1 has reached to about 0.7 V, so that the NMOS transistor 26 is turned on rapidly in a transient period of time (less than 7 ns) and the positive stress voltage from the I/O pad 22 can be discharged to the ground pad VSS via the NMOS transistor 26.

In summary, whether a positive voltage stress is applied to ground voltage VSS or a negative voltage stress is applied to voltage source VDD, both the parasitic BJT of the NMOS transistor 26 and the PMOS transistor 32 can be turned on in advance by triggering the junctions between their substrates and sources, and the ESD stress then can be discharged to the ground voltage VSS and the voltage source VDD. Hence, the capacity of the ESD protection circuit in this invention is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protection circuit disposed between an I/O pad and an internal circuit, comprising:

a first NMOS transistor whose source and gate terminal are connected to a ground voltage and whose drain terminal is connected to the I/O pad;

a second NMOS transistor whose source terminal is connected to the I/O pad, whose drain terminal is connected to a voltage source and whose gate and substrate terminal are connected to the ground voltage;

a first PMOS transistor whose drain terminal is connected to the ground voltage and a substrate terminal of the first NMOS transistor, whose gate terminal is connected to the voltage source and whose source and substrate terminal are connected to the I/O pad; and a second PMOS transistor whose source and gate terminal are connected to the voltage source, whose drain terminal is connected to the I/O pad and whose substrate terminal is connected to a drain terminal of the second NMOS transistor.

2. The electrostatic discharge protection circuit of claim 1, further comprising a resistor disposed between the drain terminal of the first PMOS transistor and the ground voltage.

3. The electrostatic discharge protection circuit of claim 1, further comprising a resistor disposed between the drain terminal of the second NMOS transistor and the voltage source.

* * * * *